(12) United States Patent
Ogawa et al.

(10) Patent No.: US 9,538,649 B2
(45) Date of Patent: Jan. 3, 2017

(54) METHOD OF MANUFACTURING MODULE

(71) Applicant: Murata Manufacturing Co., Ltd., Kyoto-fu (JP)

(72) Inventors: Nobuaki Ogawa, Kyoto-fu (JP); Yoshihito Otsubo, Kyoto-fu (JP)

(73) Assignee: MURATA MANUFACTURING CO., LTD., Kyoto-Fu (JP)

( * ) Notice: Subject to any disclaimer, the term of this patent is extended or adjusted under 35 U.S.C. 154(b) by 72 days.

(21) Appl. No.: 14/199,327

(22) Filed: Mar. 6, 2014

(65) Prior Publication Data
US 2014/0185256 A1 Jul. 3, 2014

Related U.S. Application Data

(63) Continuation of application No. PCT/JP2012/072550, filed on Sep. 5, 2012.

(30) Foreign Application Priority Data

Sep. 7, 2011 (JP) .................................. 2011-194568

(51) Int. Cl.
*H05K 3/30* (2006.01)
*H05K 1/11* (2006.01)
(Continued)

(52) U.S. Cl.
CPC ............. *H05K 1/11* (2013.01); *H01L 21/4853* (2013.01); *H01L 23/3121* (2013.01); (Continued)

(58) Field of Classification Search
CPC .......... H05K 1/11; H05K 1/181; H05K 3/284; H05K 3/303; H05K 3/4644; H05K 3/4015; H05K 3/4046; H05K 2201/0715; H05K 2201/10242; H05K 2201/1031; H05K 2201/10516; H05K 2203/1316; H01L 21/4853; H01L 23/3121; H01L 23/49811; H01L 23/5389; H01L 23/552; H01L 25/0652; H01L 25/0655; H01L 2924/1531; H01L 2924/19105; H01L 2924/19106; Y02P 70/611; Y10T 29/49146
See application file for complete search history.

(56) References Cited

U.S. PATENT DOCUMENTS 3,903,590 A * 9/1975 Yokogawa ............ H01L 23/142
257/708
5,081,563 A * 1/1992 Feng ...................... H01L 23/13
174/260
(Continued)

FOREIGN PATENT DOCUMENTS

CN     1914727 A    2/2007
JP     07-335783 A  12/1995
(Continued)

OTHER PUBLICATIONS

Office action issued in JP2013-532616 on Oct. 29, 2014.
(Continued)

*Primary Examiner* — Carl Arbes
(74) *Attorney, Agent, or Firm* — Pearne & Gordon LLP (57) ABSTRACT

When forming a module 100 having a configuration in which a column-shaped connection terminal 11, which forms an interlayer connection conductor, and an electronic component 102 are mounted on a wiring substrate 101 and sealed with a resin, the column-shaped connection terminal 11 which has a substantially T-shaped cross section and in which a first end portion has a larger diameter than a second end portion is prepared (the preparation step), an electronic component 102 is mounted on one main surface of the wiring substrate 101 and the connection terminal 11 is mounted on the one main surface in such a manner that the
(Continued)

second end portion of the connection terminal 11 having a smaller diameter is connected to the wiring substrate 101 (the mounting step), and the electronic component 102 and the connection terminal 11 are sealed with a resin layer 103 (the sealing step).

10 Claims, 4 Drawing Sheets

(51) Int. Cl.
| | | |
|---|---|---|
| *H01L 23/31* | (2006.01) | |
| *H01L 23/498* | (2006.01) | |
| *H01L 21/48* | (2006.01) | |
| *H01L 23/552* | (2006.01) | |
| *H01L 25/065* | (2006.01) | |
| *H05K 3/46* | (2006.01) | |
| *H01L 23/538* | (2006.01) | |
| *H05K 3/40* | (2006.01) | |
| *H05K 3/28* | (2006.01) | |
| *H05K 1/18* | (2006.01) | |

(52) U.S. Cl.
CPC .... *H01L 23/49811* (2013.01); *H01L 23/5389* (2013.01); *H01L 23/552* (2013.01); *H01L 25/0652* (2013.01); *H05K 3/303* (2013.01); *H05K 3/4015* (2013.01); *H05K 3/4046* (2013.01); *H05K 3/4644* (2013.01); *H01L 25/0655* (2013.01); *H01L 2224/16225* (2013.01); *H01L 2924/1531* (2013.01); *H01L 2924/19105* (2013.01); *H01L 2924/19106* (2013.01); *H05K 1/181* (2013.01); *H05K 3/284* (2013.01); *H05K 2201/0715* (2013.01); *H05K 2201/1031* (2013.01); *H05K 2201/10242* (2013.01); *H05K 2201/10515* (2013.01); *H05K 2203/1316* (2013.01); *Y02P 70/611* (2015.11); *Y10T 29/49146* (2015.01)

(56) References Cited

U.S. PATENT DOCUMENTS

| | | | | |
|---|---|---|---|---|
| 6,232,558 | B1 * | 5/2001 | Tsukada | .............. H01L 23/3121 |
| | | | | 165/185 |
| 6,324,067 | B1 * | 11/2001 | Nishiyama | ............. H05K 1/165 |
| | | | | 174/262 |
| 2009/0014859 | A1 | 1/2009 | Jeung et al. | |
| 2010/0237477 | A1 | 9/2010 | Pagaila et al. | |

FOREIGN PATENT DOCUMENTS

| | | |
|---|---|---|
| JP | 2000-307238 A | 11/2000 |
| JP | 2001-118876 A | 4/2001 |
| JP | 2001-168264 A1 | 6/2001 |
| JP | 2004-047702 A | 2/2004 |
| JP | 2004-071961 A | 3/2004 |
| JP | 2007-116185 A | 5/2007 |
| JP | 2007-287762 A | 11/2007 |
| JP | 2008-016729 A | 1/2008 |
| JP | 2008-277569 A | 11/2008 |
| JP | 2009-246104 A | 10/2009 |
| JP | 2010-118614 A | 5/2010 |
| JP | 2010-141226 A | 6/2010 |
| JP | 2010-245157 A | 10/2010 |
| JP | 2010-278069 A | 12/2010 |
| WO | 2005/078796 A1 | 8/2005 |
| WO | 2008/065896 A1 | 6/2008 |
| WO | 2009136496 A1 | 11/2009 |

OTHER PUBLICATIONS

Office action issued in CN2012-80043580.1 on Feb. 2, 2016.
International Search Report for Application No. PCT/JP2012/072550 dated Dec. 11, 2012.
Written Opinion of the International Searching Authority for Application No. PCT/JP2012/072550 dated Dec. 11, 2012.

* cited by examiner

METHOD OF MANUFACTURING MODULE

BACKGROUND OF THE INVENTION

1. Field of the Invention

The present invention relates to methods of manufacturing a module that includes a plurality of connection terminals forming interlayer connection conductors and relates to the module.

2. Description of the Related Art

Figure 8:
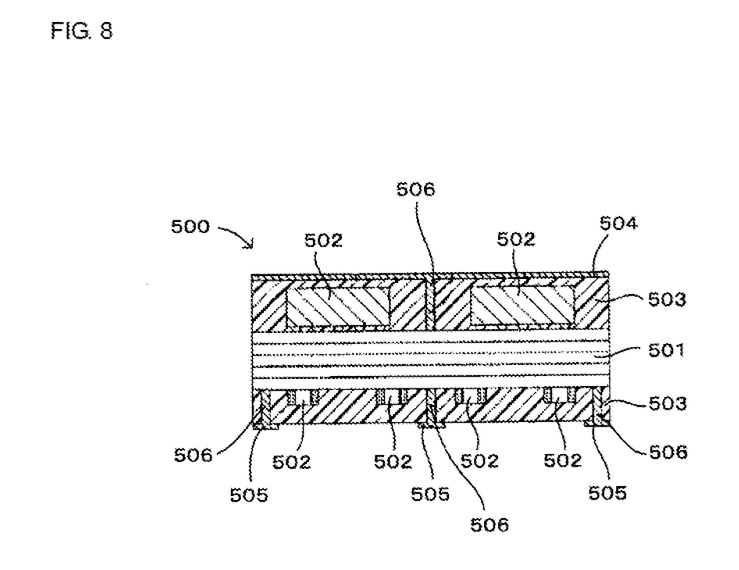
FIG. 8 is a diagram illustrating an example module of the related art.

To date, as shown by an example module illustrated in FIG. 8, a module 500 is known in which various electronic components 502 mounted on both surfaces of a wiring substrate 501 are sealed with resin layers 503 (for example, refer to Patent Document 1). In this case, a metal shield layer 504 is provided on one main surface of the module 500, and mounting electrodes 505 for external connection are provided on the other main surface. The metal shield layer 504 and the mounting electrodes 505 are electrically connected to the wiring layer of the wiring substrate 501 through respective via conductors 506 for interlayer connection.

Patent Document 1: International Publication No. 2005/078796 (paragraphs 0017-0025 and 0035, FIG. 1, Abstract, and others)

BRIEF SUMMARY OF THE INVENTION

However, in the invention disclosed in Patent Document 1, the via conductors 506 are formed in such a manner that via holes formed by a laser process in the resin layers 503 provided in the wiring substrate 501 are, after desmearing processing, filled with conductor paste including, for example, Ag and Cu, or subjected to via fill plating processing. When the via holes are formed in the resin layers 503 by a laser process in this manner, it is difficult to adjust the output power of a laser, resulting in a problem in that there are variations in the accuracy with which the via holes are formed. Further, since the via conductors 506 are formed in the resin layers 503 through a plurality of process steps, the manufacturing cost of the module is increased and it is difficult to reduce the time required to manufacture the module. In addition, there is a problem in that a chemical solution used when via holes formed in the resin layers 503 by a laser process are subjected to desmearing processing or a chemical solution used for via fill plating processing erodes the resin layers 503 and the wiring substrate 501.

In view of the above-described problems, it is an object of the present invention to provide a low-cost module which enables interlayer connection without providing via holes and which can be manufactured in a short time.

In order to achieve a first object described above, the method of manufacturing a module according to the present invention is a method of manufacturing a module that is formed in such a manner that a column-shaped connection terminal forming an interlayer connection conductor and an electronic component are mounted on a wiring substrate and sealed with a resin, and the method includes: a preparation step of preparing a column-shaped connection terminal which has a substantially T-shaped cross section, and a first end portion of the connection terminal having a larger diameter than a second end portion of the connection terminal; a first mounting step of mounting an electronic component on one main surface of the wiring substrate and mounting the connection terminal on the one main surface of the wiring substrate in such a manner that the second end portion of the connection terminal having a smaller diameter is connected to the wiring substrate; and a first sealing step of sealing the electronic component and the connection terminal with a resin layer (claim 1).

In the preparation step, a support body having a magnetic force is made to attract large-diameter first end portions of the plurality of connection terminals, and in the first mounting step, the plurality of connection terminals that have been attracted onto the support body may be mounted on the wiring substrate (claim 2).

A removal step of removing the support body may be included prior to the first sealing step (claim 3).

A step of grinding a surface of the resin layer may be further included subsequent to the first sealing step (claim 4).

In the step of grinding, in addition to grinding the surface of the resin layer, the first end portion of the connection terminal may be polished or ground (claim 5).

A second mounting step of mounting another electronic component on another main surface of the wiring substrate, and a second sealing step of sealing the other electronic component with a resin layer may be further included (claim 6).

In the second mounting step, the connection terminal may be further mounted in such a manner that the second end portion of the connection terminal is connected to the other main surface of the wiring substrate (claim 7).

A third mounting step of mounting another electronic component in such a manner that the other electronic component is connected to the first end portion of the connection terminal mounted on the other main surface of the wiring substrate may be further included (claim 8).

In a module in which a plurality of electronic components are mounted on at least one main surface of a wiring substrate, the module includes: a column-shaped connection terminal which has a substantially T-shaped cross section and a first end portion of the connection terminal having a larger diameter than a second end portion of the connection terminal, and is mounted on the at least one main surface of the wiring substrate and forming an interlayer connection conductor; and a resin layer covering the electronic component and the connection terminal on the at least one main surface of the wiring substrate. The second end portion of the connection terminal is connected to the wiring substrate, and the first end portion of the connection terminal is exposed at a surface of the resin layer (claim 9).

In the module, the large-diameter first end portion of the connection terminal and the electronic component are arranged in such a manner as to be superposed with each other when the wiring substrate is viewed in a longitudinal direction of the connection terminal (claim 10).

According to the invention of claim 1, a column-shaped connection terminal which has a substantially T-shaped cross section and forms an interlayer connection conductor where a first end portion of the connection terminal has a larger diameter than a second end portion of the connection terminal is prepared, and the connection terminal is mounted on one main surface of a wiring substrate together with an electronic component.

At this time, the connection terminal is attracted onto a suction unit of a mounting apparatus or the like and mounted on the wiring substrate. In the case of a connection terminal whose two ends have the same diameter, there may be a case in which it is difficult to ensure a suction area sufficient for stable suction, and in such a case, suction errors at the time of mounting the connection terminal may frequently occur. On the other hand, the connection terminal of the present invention is formed in such a manner as to have a first end portion with a large diameter, and is mounted on the wiring substrate by means of suction of this end portion. Hence, the suction errors at the mounting time are reduced and the productivity is increased.

Further, the electronic component and the connection terminal are sealed with a resin layer after they have been mounted on the one main surface of the wiring substrate. Since nothing has been, for example, mounted on the upper surface of the resin layer, it is ensured that there are many paths through which voids generated in the resin layer during the formation of the resin layer can escape and, hence, a module including few voids can be manufactured.

Further, since an interlayer connection conductor is formed of the connection terminal subsequent to the sealing with the resin layer, there is no need to provide via holes as in the related art, resulting in reductions in the manufacturing cost and manufacturing time of the module. In addition, a problem is prevented in which a chemical solution used for desmearing processing or a chemical solution used for via fill plating erodes the resin layer and the wiring substrate as in the related art.

According to the invention of claim 2, a support body having a magnetic force is made to attract the first end portions of the plurality of connection terminals, whereby the plurality of connection terminals are mounted at a time and the productivity is further increased.

According to the invention of claim 3, since the support body which has attracted the plurality of connection terminals is removed prior to the first sealing step, filling capabilities of a resin with which the one main surface of the wiring substrate is filled to form the first resin layer are increased. In addition, air sealed in the resin is likely to escape and generation of voids in the first resin layer is suppressed.

Further, since the support body which could be a barrier for resin sealing has been removed, various resins including a liquid resin and a resin sheet, can be used, whereby the first resin layer can be formed using any of various generally known methods.

According to the invention of claim 4, since the surface of the resin layer is polished or ground subsequent to the first sealing step, the surface of the resin can be flattened and the module can be made so as to have a low profile.

According to the invention of claim 5, in the grinding step, the first end portion of the connection terminal is polished or ground together with the surface of the resin layer and, hence, lands for external connection can be formed on the surface of the first resin layer. In addition, since the land is formed of the first end portion, having a large area, of the connection terminal, the connection strength and electrical connectivity for external connection are enhanced.

According to the invention of claim 6, a practical configuration is obtained since the density of the electronic components mounted in the module can be increased, as a result of the electronic components being mounted on the other main surface of the wiring substrate and the electronic components mounted on the other main surface of the wiring substrate being sealed with the second resin layer.

According to the invention of claim 7, since a connection terminal is mounted also on the other main surface of the wiring substrate, an advantageous effect similar to that of claim 1 is obtained also for the other main surface.

According to the invention of claim 8, since another electronic component is mounted in such a manner that the other electronic component is connected to the first end portion of the connection terminal mounted on the other main surface of the wiring substrate, the density of electronic components mounted in the module can be further increased, resulting in a practical configuration.

According to the invention of claim 9, since a column-shaped connection terminal which has a substantially T-shaped cross section is mounted on at least one main surface of the wiring substrate, thereby forming an interlayer connection conductor, the module can be provided while realizing reductions in cost and manufacturing time, compared with the case in which the interlayer connection conductor is formed of a via hole as in the related art. Further, since the second end portion of the connection terminal is connected to the wiring substrate and the first end portion having a larger diameter than the second end portion is exposed at a surface of the resin layer that covers the electronic component and the connection terminal mounted on the wiring substrate, an external connection land having a large area is formed on the surface of the resin layer. Hence, since an external connection land having a large area is formed on the surface of the resin layer, the connection strength and electrical connectivity for external connection of the module are enhanced.

Further, since the external connection land exposed at the surface of the resin layer is formed integrally with the column-shaped connection terminal whose cross section is substantially T-shaped, the connection strength between the land and the interlayer connection conductor can be increased, compared with the case in which the land is formed on the connection terminal exposed at the surface of the resin layer using, for example, screen printing or photolithography.

According to the invention of claim 10, the large-diameter first end portion of the connection terminal and the electronic component are arranged in such a manner as to be superposed with each other when the wiring substrate is viewed in a longitudinal direction of the connection terminal. In other words, since the connection terminal is connected to the wiring substrate at the second end portion thereof having a small diameter, a large mounting area of the wiring substrate is ensured, and the electronic component can be arranged at a position which is superposed with the first end portion (large-diameter side) when the wiring substrate is viewed in the longitudinal direction of the connection terminal. As a result, the module can be reduced in size while ensuring a large land for external connection at the first end portion of the connection terminal.

BRIEF DESCRIPTION OF THE SEVERAL VIEWS OF THE DRAWINGS

FIGS. 1(*a*) and 1(*b*) are diagrams illustrating a method of manufacturing the connection terminals used in a module according to a first embodiment of the present invention.

FIGS. 3(*a*)-3(*d*) are diagrams illustrating a method of manufacturing the module according to the first embodiment of the present invention.

DETAILED DESCRIPTION OF THE INVENTION

First Embodiment

Figure 1:
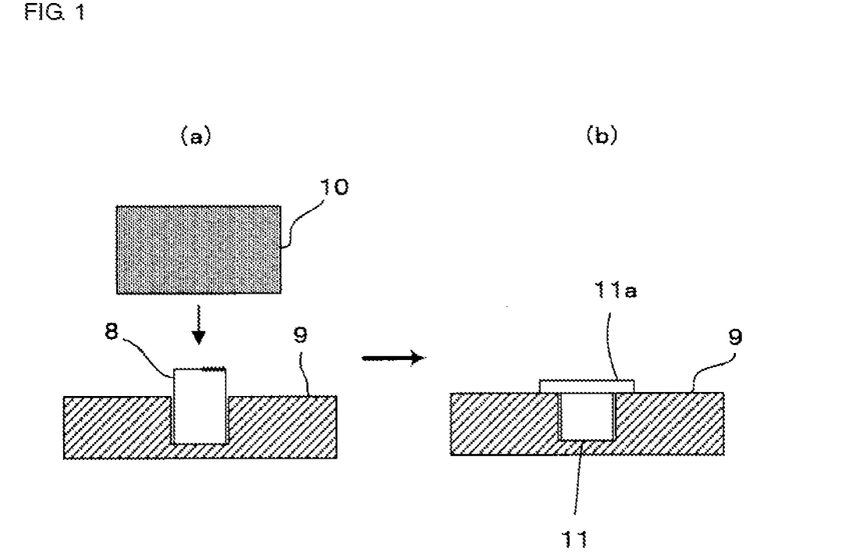
Figure 2:
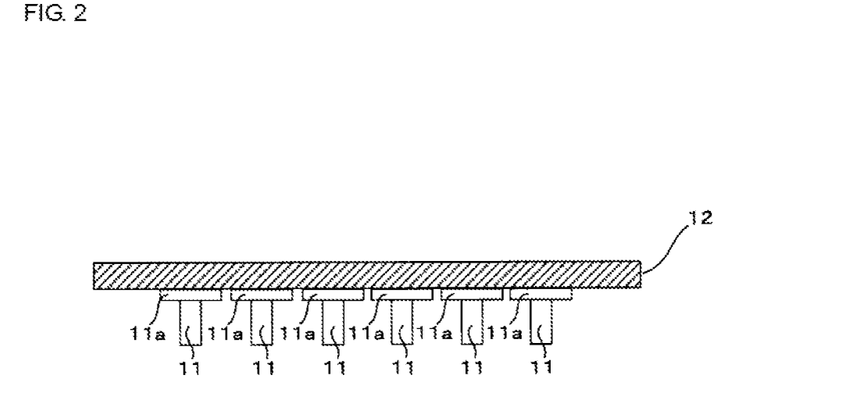
FIG. 2 is a diagram illustrating the connection terminals used in the module according to the first embodiment of the present invention.
Figure 3:
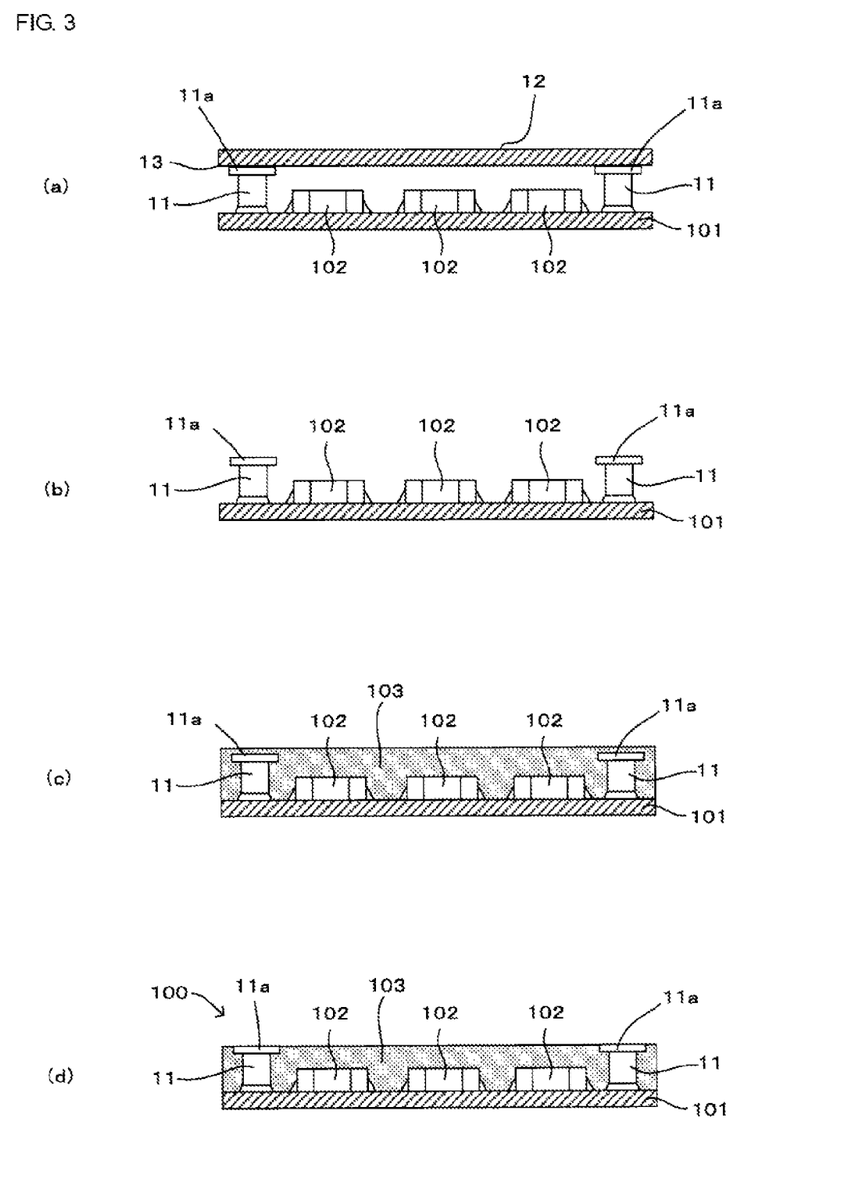
Figure 4:
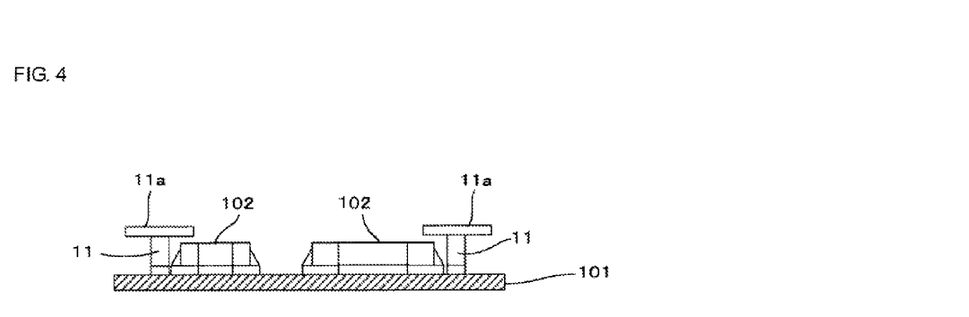
FIG. 4 is a diagram illustrating an example of the arrangement of the electronic components.

A module according to a first embodiment of the present invention will be described with reference to FIG. 1 to FIG. 4. FIG. 1 is a diagram illustrating a method of manufacturing the connection terminals used in a module according to the first embodiment, FIG. 2 is a diagram illustrating the connection terminals, and FIG. 3 is a diagram illustrating a method of manufacturing the module according to the first embodiment, where (a) to (d) respectively illustrate different steps. FIG. 4 is a diagram illustrating an example of the arrangement of electronic components.

The method of manufacturing a module described in the present embodiment is used for manufacturing high-frequency circuit modules mounted, for example, on the mother boards of communication mobile terminals, such as various communication modules including a Bluetooth (registered trade mark) module and a wireless LAN module, an antenna switch module, and a power supply module.

(Method of Manufacturing Modules)

Referring to FIG. 1 to FIG. 4, the method of manufacturing the connection terminal of the present invention will be described.

First, a line member 8 made of a metal conductor having a desired sectional diameter is prepared, and the line member 8 is sheared into a desired length. Regarding a sheared surface at this time, although a flat surface is obtained at the beginning of shearing, a rough surface is formed during a later period just prior to the end of shearing, because a strong tearing force is applied to the line member 8.

Then, referring to FIG. 1(a), the line member 8 is set in a jig 9 having a depression which is formed in such a manner as to make the line member 8 partly protrude above the jig 9, and the protrusion of the line member 8 is pressed from above using a press machine 10, thereby forming a column-shaped connection terminal 11 (FIG. 1(b)). At this time, as illustrated in FIG. 1(b), a first end portion of the connection terminal 11 has a flange portion 11a and the connection terminal 11 has a substantially T-shaped section. Thus, the connection terminal 11 is formed in such a manner as to have the first end portion having a larger diameter than the second end portion.

Further, a rugged portion causing the roughness of the sheared surface described above is flattened by being pressed and, hence, the whole sheared surface of the line member 8 is flattened.

The connection terminal 11 is mounted on a wiring substrate 101 with the second end portion having a smaller diameter facing downward and, hence, when the flange portion 11a is too large, the connection terminal 11 may possibly fall after having been mounted or during reflowing. Hence, it is preferable that the flange portion 11a of the connection terminal 11 be formed in such a manner that the center of gravity of the connection terminal 11 is located below or equal to two-thirds of the height of the T-shaped section.

Next, referring to FIG. 2, a collection of a plurality of the connection terminals 11 is prepared, where the large-diameter first end portions of the connection terminals 11 are supported at predetermined positions on one surface of a support body 12. Note that a plate-shaped support body having a magnetic force may be used as the support body 12. In this case, it is possible to prepare the aggregate of the connection terminals 11 where the connection terminals 11 are supported by the support body 12, by the flange portions 11a of the connection terminals 11 attracted onto the support body 12.

In more detail, the connection terminals 11 are fed into arrayed holes which are formed in an inserting jig and which are larger than the diameters of the connection terminals 11 in such a manner that the first end portions (flange portions 11a) protrude from the holes. Then, the support body 12 is pressed against the protruding first end portions (flange portions 11a) of the connection terminals 11, thereby making the support body 12 support the connection terminals 11. After this, the connection terminals 11 together with the support body 12 are drawn out of the jig, whereby the collection of the connection terminals 11 is produced.

Note that the support body 12 need not necessarily have a magnetic force. For example, the collection of the connection terminals 11 may be realized in such a manner that an adhesive support layer (not illustrated) is formed on the support body 12 and the large-diameter first end portions of the connection terminals 11 are supported by the support body 12 via the support layer.

Then, referring to FIG. 3(a), the support body 12 supporting a plurality of the connection terminals 11 and electronic components 102, such as various chip components and ICs, are mounted on the predetermined positions of the one main surface of the wiring substrate 101 using a general surface mount technology (the first mounting step), such as solder reflow connection, ultrasound connection, or conductive paste connection. At this time, the connection terminals 11 are mounted in such a manner that the second ends of the connection terminals 11 are connected to the wiring substrate 101. Note that the connection terminals 11 may be mounted one by one on the wiring substrate 101 by attracting the connection terminal 11 using an ordinary suction method, such as magnetic attraction, vacuum suction, or electrostatic suction, without supporting the connection terminals 11 with the support body 12.

In the present embodiment, the wiring substrate 101 is a multilayer ceramic substrate formed by laminating a plurality of ceramic green sheets and sintering them. A ceramic green sheet is formed by making a sheet of slurry which is made of a mixture of, for example, alumina and glass powder mixed together with an organic binder and a solvent. Then via holes are formed in the ceramic green sheet at the predetermined positions through laser processing or the like. The formed via holes are filled with conductive paste including Ag, Cu, and the like, whereby via conductors for interlayer connection are formed. Various electrode patterns are formed by applying conductive paste by printing. Then, a plurality of ceramic green sheets are laminated and pressed, thereby forming a ceramic multilayer body. The ceramic multilayer body is subjected to low-temperature sintering, i.e., sintered at a low temperature of about 1000° C.

Thus, the wiring substrate 101 includes various electrode patterns formed therein or thereon, such as internal wiring patterns, mounting electrodes on which the connection terminals 11 and the electronic components 102 are mounted, and external connection electrodes. The wiring substrate 101 may be formed of a printed substrate made of a resin or a polymer material, an LTCC substrate, an alumina substrate, a glass substrate, a composite material substrate, a single-layer substrate, or a multilayer substrate or the like. The wiring substrate 101 may be formed by selecting an appropriate and optimum material in accordance with the objective for which a module 100 is used.

Next, referring to FIG. 3(*b*), the support body 12 supporting the connection terminals 11 which are mounted on the one main surface of the wiring substrate 101 is removed from the connection terminals 11 (the removal step).

Then, referring to FIG. 3(*c*), the one main surface of the wiring substrate 101 is filled with a resin, whereby the electronic components 102 and the connection terminals 11 mounted on the one main surface of the wiring substrate 101 are sealed with a first resin layer 103 (the first sealing step). The first resin layer 103 may be formed of a composite resin which is formed by mixing a thermosetting resin, such as an epoxy resin, a phenol resin, or a cyanate resin, with an inorganic filler, such as aluminum oxide, silica (silicon dioxide), or titanium dioxide.

For example, when the first resin layer 103 is formed using a resin sheet, which is made of a composite resin molded on a PET film and half-hardened, the wiring substrate 101, in a state in which a spacer (mold) with a desired thickness is arranged at the surrounding, is covered with the resin sheet. The resin sheet is heated and pressed so as to have the thickness of the spacer, and then the wiring substrate 101 is heated in an oven, thereby hardening the resin. As a result, the first resin layer 103 having a desired thickness is formed. Note that the first resin layer 103 may be formed using a general molding technology for forming a resin layer, such as a potting technology which uses a liquid resin, a transfer molding technology, or a compression molding technology.

Then, referring to FIG. 3(*d*), an unnecessary resin is removed by grinding the surface of the first resin layer 103 (the grinding step), whereby the surface of the first resin layer 103 is flattened. Note that the first end portions of the connection terminals 11 may be polished or ground at the same time as when the resin is polished or ground. In this manner, the first end portions of the connection terminals 11 are exposed. This completes the production of the module 100 having external connection terminals (lands) formed thereon, which are formed of the first end portions of the connection terminals 11 exposed at the surface of the first resin layer 103. The first end portions of the connection terminals 11 exposed at the surface of the first resin layer 103 may be plated with, for example, Ni/Au. At this time, when there are variations in the heights of the connection terminals 11 above the wiring substrate 101 due to, for example, the influence of the variations in the thickness of solder connecting the second ends of the connection terminals 11 to the wiring substrate 101, the heights of the connection terminals 11 above the wiring substrate 101 may be made the same by grinding the first ends of the connection terminals 11 together with the first resin layer 103.

Note that when the surface of the first resin layer 103 is polished or ground, the whole flange portions 11*a* formed on the first end portions of the connection terminals 11 may be removed together with the resin of the first resin layer. In this manner, the cross sections of the connection terminals 11 are exposed at the surface of the first resin layer 103 as external connection terminals. As a result, the external connection terminals having uniform areas can be provided on the surface of the first resin layer 103.

Further, in the first sealing step, when the first resin layer 103 is formed in such a manner that the first ends (first end portions) of the connection terminals 11 are exposed, the step of grinding the surface of the first resin layer 103 need not necessarily be performed.

Further, the first resin layer 103 may be formed by filling the one main surface of the wiring substrate 101 with a resin without removing the support body 12 supporting the connection terminals 11. In this case, the support body 12 may be removed by grinding the support body 12 together with the first resin layer 103 in the grinding step.

When the connection terminals 11 are attracted one by one using an ordinary suction method, if the diameter of the connection terminal 11 is small, suction errors may occur frequently, thereby causing a decrease in productivity. Regarding this point, the connection terminal 11 in the present invention has the flange portion 11*a* at the first end portion thereof and this portion is attracted. Hence, a sufficient suction area is ensured, resulting in a reduction in suction error. Further, the flange portion 11*a* is formed in such a manner that the rugged portion of the surface of the flange portion 11*a*, generated when the line member 8 is sheared in desired length, is flattened by being pressed and, hence, suction errors are further reduced and productivity is increased. In addition, also when the plurality of connection terminals 11 are supported as a result of the plate-shaped support body 12 having a magnetic force attracting them, since the connection terminals 11 have the flange portions 11*a*, sufficient suction areas are ensured, whereby the connection terminals 11 are supported by the plate-shaped support body 12 having a magnetic force with reduced attraction errors, resulting in an increase in productivity.

Further, since the connection terminals 11 and the support body 12 can be mounted only by changing the shape of, for example, a suction collet of a component mounter for mounting the electronic components 102, existing equipment can advantageously be used. In addition, the connection terminals 11 form interlayer connection conductors and there is no need to form via holes as in the related art. In other words, the present invention has a great advantage in that interlayer connection conductors can be formed only with a component mounter.

Further, the connection terminal 11, which is formed of a metal conductor, can be easily attracted onto the support body 12 having a magnetic force. Since the large-diameter first end side of the connection terminal 11 is attracted onto the support body 12, the connection terminal 11 can be more reliably attracted onto the support body 12, resulting in an increase in productivity. In addition, since the connection terminal 11 has been attracted onto the support body 12 through a magnetic force, the support body 12 can be easily removed compared with the case in which the connection terminal 11 is attached to the support body 12 using an adhesive or the like.

Further, since the plurality of connection terminals 11 are attracted onto the support body 12 and thereby mounted on the wiring substrate 101, the production efficiency is increased.

Further, the support body 12 is removed after the connection terminals 11 and the electronic components 102 have been mounted and before the first resin layer 103 is formed (the first sealing step). Hence, the one main surface of the wiring substrate 101 is filled with a resin to form the first resin layer 103, with increased efficiency. In addition, air sealed within the resin can easily escape, whereby the generation of voids in the first resin layer 103 is suppressed.

Further, since the support body 12 supporting the connection terminals 11 mounted on the one main surface of the wiring substrate 101 is removed before performing the resin sealing, various types of resin, such as a liquid resin and a resin sheet can be used to form the first resin layer 103 and, hence, the first resin layer 103 can be easily formed using any of various generally known methods.

Further, by grinding the surface of the first resin layer 103 after the first sealing step, the surface of the first resin layer 103 can be flattened and, at the same time, the module 100 can be made so as to have a low profile.

Further, by trimming the first ends (first end portions) of the connection terminals 11 in addition to the surface of the first resin layer 103 in the grinding step, the lands for external connection formed of the first ends of the connection terminals 11 can be easily formed on the surface of the first resin layer 103.

Further, the connection terminals 11 in the present embodiment each have the flange portion 11a formed on the first end portion thereof opposite the end portion connected to the wiring substrate 101. Hence, in the grinding step, by grinding part of each of the flange portions 11a together with the first resin layer 103, external connection lands having a larger area than the cross sections of the connection terminals 11 are formed of the flange portions 11a on a surface of the first resin layer 103. As a result, the module 100 can be provided with large-area external connection lands and, hence, electric connectivity at the time when the module 100 is mounted, for example, on the mother board of a communication mobile terminal can be enhanced. In this case, since the external connection land (flange portion 11a) exposed at the surface of the first resin layer 103 is formed integrally with the connection terminal 11, the connection strength between the land (flange portion 11a) and the connection terminal 11 can be increased, compared with the case in which the land is formed on the connection terminal 11 exposed at the surface of the first resin layer 103 using, for example, screen printing or photolithography.

Further, since the electric connectivity or connection strength required for connection to, for example, a mother board is ensured by the flange portions 11a having a large area, the connection terminals 11 can be formed in such a manner as to have a smaller diameter than the lands (flange portions 11a) for external connection.

Further, since interlayer connection conductors are formed of the connection terminals 11 after sealing with the first resin layer 103, there is no need to provide via holes as in the related art, resulting in reductions in the manufacturing cost and manufacturing time of the module 100. In addition, a problem is prevented in which a chemical solution used for desmearing processing or a chemical solution used for via fill plating erodes the resin layer and the wiring substrate as in the related art.

In the present embodiment, since the connection terminals 11 are connected to the wiring substrate 101 at the second end portions thereof having a small diameter, it is ensured that the mounting area of the wiring substrate 101 is kept large, whereas on the upper surface of the first resin layer 103, large lands are formed of the flange portions 11a which are the first end portions, having a large diameter, of the connection terminals 11. As a result, referring to FIG. 4, the electronic components 102 can be arranged at positions which are superposed with the first end portions (large-diameter side) when the wiring substrate 101 is viewed in the longitudinal direction of the connection terminals 11. Hence, the module 100 can be reduced in size while ensuring large lands for external connection on the first end portion side of the connection terminals 11. Note that in FIG. 4, the flange portions 11a of the connection terminals 11 are illustrated in such a manner as to be slightly exaggerated for ease of understanding.

Second Embodiment

Figure 5:
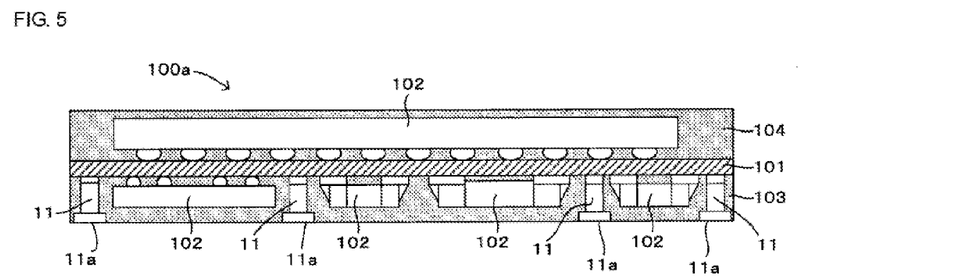
FIG. 5 is a diagram illustrating a module according to a second embodiment of the present invention.

A module 100a according to a second embodiment of the present invention will be described with reference to FIG. 5. FIG. 5 is a diagram illustrating the module 100a according to the second embodiment of the present invention.

Unlike the first embodiment described above, in the module 100a of the present embodiment, the electronic components 102 are further mounted on the other main surface of the wiring substrate 101 of the module 100a (the second mounting step), and these electronic components 102 are sealed with a second resin layer 104 (the second sealing step), as illustrated in FIG. 5. The rest of the configuration is the same as that of the above-mentioned first embodiment and the description thereof is omitted by attaching the same reference symbols to components common in the embodiments.

Accordingly, this configuration is practical since the density of the electronic components 102 mounted in the module 100a can be increased, as a result of the electronic components 102 being mounted on the other main surface of the wiring substrate 101 and the electronic components 102 mounted on the other main surface of the wiring substrate 101 being sealed with the second resin layer 104.

Third Embodiment

Figure 6:
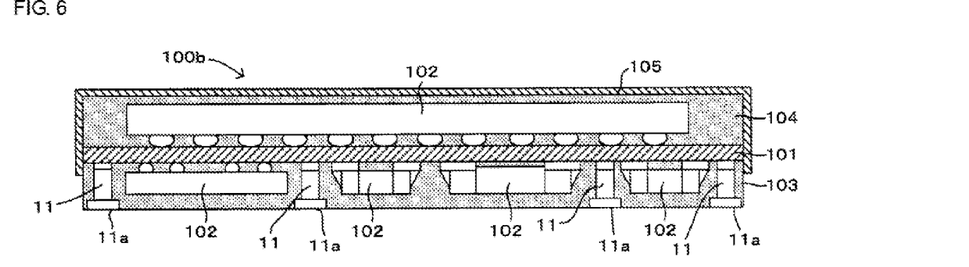
FIG. 6 is a diagram illustrating a module according to a third embodiment of the present invention.

A module 100b according to a third embodiment of the present invention will be described with reference to FIG. 6. FIG. 6 is a diagram illustrating the module 100b according to the third embodiment of the present invention.

Unlike the second embodiment described above, in the module 100b according to the present embodiment, a metal shield layer 105 is provided on the second resin layer 104 which is provided on the other main surface of the wiring substrate 101 of the module 100b, as illustrated in FIG. 6. The rest of the configuration is the same as that of the first and second embodiments and the description thereof is omitted by attaching the same reference symbols to components common in the embodiments. Note that it is preferable that the metal shield layer 105 be electrically connected to GND wiring provided at the wiring substrate 101.

With this configuration, since the metal shield layer 105 is provided on the second resin layer 104, in particular, noise is inhibited from propagating from the outside to the electronic components 102 sealed by the second resin layer 104, and electromagnetic waves or the like are inhibited from radiating from the electronic components 102 sealed by the second resin layer 104.

Fourth Embodiment

Figure 7:
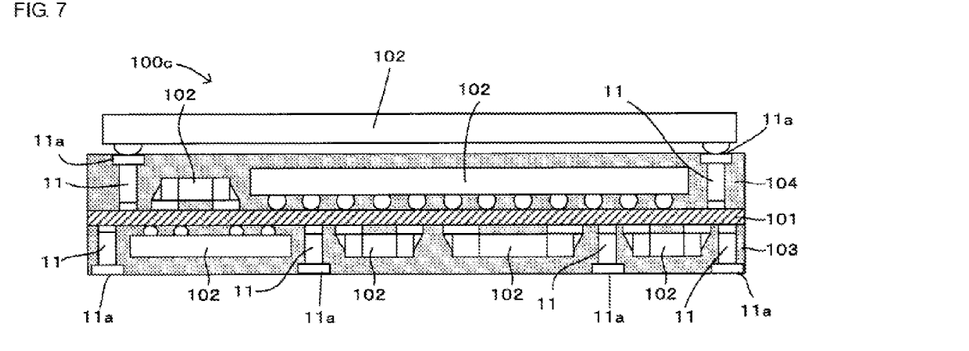
FIG. 7 is a diagram illustrating a module according to a fourth embodiment of the present invention.

A module 100c according to a fourth embodiment of the present invention will be described with reference to FIG. 7. FIG. 7 is a diagram illustrating the module 100c according to the fourth embodiment of the present invention.

Unlike the second embodiment described with reference to FIG. 5, in the module 100c according to the present embodiment, the connection terminals 11 are mounted on the other main surface of the wiring substrate 101 of the module 100c (the second mounting step), as illustrated in FIG. 7, whereby interlayer connection conductors formed of the connection terminals 11 are provided in the second resin layer 104. The second resin layer 104 is formed in such a manner that, after the support body 12 supporting the plurality of connection terminals 11 mounted on the other main surface of the wiring substrate 101 has been removed from the connection terminals 11, the other main surface is filled with a resin.

In this embodiment, the electronic component 102 is further mounted on the second resin layer 104 (the third mounting step) in such a manner as to be connected to the interlayer connection conductors formed of the connection terminals 11 which are provided in the second resin layer 104. The rest of the configuration is the same as that of the first to third embodiments and the description thereof is omitted by attaching the same reference symbols to components common in the embodiments.

With this configuration, since the connection terminals 11 are further mounted on the other main surface of the wiring substrate 101, interlayer connection conductors can be formed in the second resin layer 104. Further, since the support body 12 of the other main surface of the wiring substrate 101 is removed from the connection terminals 11 before the electronic components 102 and the connection terminals 11 mounted on the other mains surface of the wiring substrate 101 are sealed with the second resin layer 104, the other main surface of the wiring substrate 101 can be efficiently filled with a resin for forming the second resin layer 104.

Further, since the electronic component 102 is further mounted on the second resin layer 104 formed in the second sealing step in such a manner as to be mounted on the connection terminals 11 provided in the second resin layer 104, the density of the electronic components 102 mounted in the module 100c can be further increased, resulting in a practical configuration.

Note that the present invention is not limited to the embodiments described above, and various modifications are possible other than those described above within the scope of the present invention.

Although the method of manufacturing modules one by one has been described in the embodiments described above, modules may be manufactured in such a manner that a collection of the plurality of modules is formed and then cut into individual modules. In this case, when the support bodies 12 supporting the plurality of connection terminals 11 are mounted on the collection of the wiring substrates 101, a collection of the support bodies 12 prior to being cut into individual pieces may be mounted on the collection of the wiring substrates 101. In this manner, since a time required to mount the support bodies 12 on the wiring substrates 101 is reduced, a time required to manufacture the modules can be reduced. Alternatively, a plurality of the support bodies 12 each supporting a plurality of the connection terminals 11 corresponding to an individual module may be mounted on the collection of the wiring substrates 101. In this manner, a plurality of the connection terminals 11 can be mounted with high positional accuracy.

The present invention can be widely applied to technologies of forming interlayer connection conductors of a module, by mounting column-shaped connection terminals on the wiring substrate of a module using a surface mount technology.

11 connection terminal
11a flange portion
12 support body
100, 100a, 100b, 100c modules
101 wiring substrate
102 electronic component
103 first resin layer
104 second resin layer

The invention claimed is:

1. A method of manufacturing a module comprising a wiring substrate, one or more column-shaped connection terminals forming an interlayer connection conductor, and one or more first electronic components, the column-shaped connection terminals and the first electronic components being mounted on the wiring substrate and sealed with a resin, the method comprising:
   a providing step of providing one or more column-shaped connection terminals each having a substantially T-shaped cross section, a first end portion of each of the connection terminals having a larger diameter than a second end portion of each of the connection terminals;
   a first mounting step of mounting one or more first electronic components on one main surface of the wiring substrate, and mounting the connection terminals on the one main surface of the wiring substrate in such a manner that the second end portion of each of the connection terminals having a smaller diameter is connected to the wiring substrate; and
   a first sealing step of sealing the first electronic components and the connection terminals with a resin layer.

2. The method of manufacturing the module according to claim 1,
   wherein in the providing step, the connection terminals are a plurality of connection terminals, and the first end portion of each of the plurality of connection terminals having a larger diameter is adhered to a support body having a magnetic force, and
   wherein, in the first mounting step, the plurality of connection terminals adhered to the support body are mounted.

3. The method of manufacturing the module according to claim 2, further comprising a step of polishing or grinding a surface of the resin layer subsequent to the first sealing step.

4. The method of manufacturing the module according to claim 2, further comprising a removal step of removing the support body prior to the first sealing step.

5. The method of manufacturing the module according to claim 4, further comprising a step of polishing or grinding a surface of the resin layer subsequent to the first sealing step.

6. The method of manufacturing the module according to claim 1, further comprising a step of polishing or grinding a surface of the resin layer subsequent to the first sealing step.

7. The method of manufacturing the module according to claim 1, wherein, in the step of polishing or grinding, in addition to polishing or grinding the surface of the resin layer, the first end portion of each of the connection terminals is polished or ground.

8. The method of manufacturing the module according to claim 1, further comprising:
   a second mounting step of mounting one or more second electronic components on another main surface of the wiring substrate; and
   a second sealing step of sealing the second electronic components with a resin layer.

9. The method of manufacturing the module according to claim 8,
   wherein in the second mounting step, the connection terminals are further mounted in such a manner that the second end portion of each of the connection terminals is connected to the other main surface of the wiring substrate.

10. The method of manufacturing the module according to claim 9, further comprising a third mounting step of mounting one or more third electronic components in such a manner that the third electronic components are connected to the first end portion of each of the connection terminals mounted on the other main surface of the wiring substrate.

\* \* \* \* \*